United States Patent [19]
Li et al.

[11] Patent Number: 5,928,005
[45] Date of Patent: Jul. 27, 1999

[54] SELF-ASSEMBLED LOW-INSERTION FORCE CONNECTOR ASSEMBLY

[75] Inventors: Che-yu Li; Matti A. Korhonen, both of Ithaca, N.Y.

[73] Assignee: Cornell Research Foundation, Inc., Ithaca, N.Y.

[21] Appl. No.: 09/028,992

[22] Filed: Feb. 25, 1998

Related U.S. Application Data

[60] Provisional application No. 60/039,060, Feb. 28, 1997.
[51] Int. Cl.$^6$ ................................................ H01R 9/09
[52] U.S. Cl. .......................... 439/82; 439/632; 439/825
[58] Field of Search ............................. 439/82, 78, 825, 439/632

[56] References Cited

U.S. PATENT DOCUMENTS

| | | | |
|---|---|---|---|
| 3,008,245 | 11/1961 | Meuche | 35/19 |
| 3,275,736 | 9/1966 | Hotine et al. | 174/84 |
| 3,545,080 | 12/1970 | Evans | 29/629 |
| 3,670,409 | 6/1972 | Reimer | 29/625 |
| 4,943,846 | 7/1990 | Shirling | 357/80 |
| 4,950,173 | 8/1990 | Minemura | 439/82 |
| 5,199,879 | 4/1993 | Kohn et al. | 439/63 |
| 5,366,380 | 11/1994 | Reymond | 439/66 |
| 5,514,839 | 5/1996 | Bender | 174/262 |
| 5,548,486 | 8/1996 | Kman et al. | 361/791 |
| 5,587,890 | 12/1996 | Happ et al. | 361/826 |
| 5,632,631 | 5/1997 | Fjelstad et al. | 439/82 |

*Primary Examiner*—Neil Abrams
*Assistant Examiner*—J. F. Duverne
*Attorney, Agent, or Firm*—Brown, Pinnisi & Michaels, P.C.

[57] ABSTRACT

A low insertion force connection using two interfitting components: a tapered element and a beam element which is deformed by the tapered element in the region where the primary forces are buckling, rather than bending. The present invention is based on pressure engaged insert/receptacle type of connections that are self-assembling, and require a minimized insertion force to produce a high and tunable contact force that is not applied through the component to be attached. Apart from differences in size, the same design principles are applicable from the chip level to the board level of a microelectronic system. The invention comprises a low cost pressure engaged electrical and thermal connection, based on insert/receptacle structures in which the contact force and insertion force are separated. Such a design allows tunable contact force while it minimizes the insertion force and allows also for self-assembly and reworkability. They can readily be used in area array configurations and in conformal 3-D electronic packaging structures in all connection levels of a microelectronic system.

31 Claims, 5 Drawing Sheets

Fig. 1a       Fig 1b       Fig. 1c
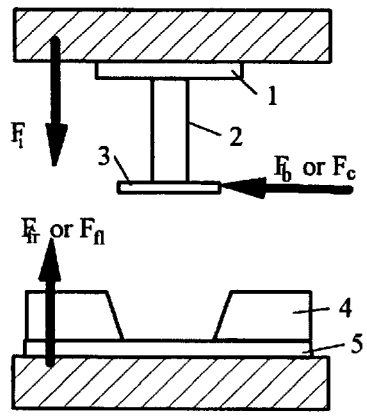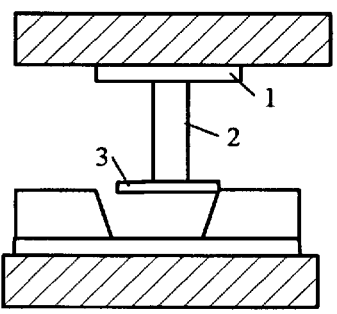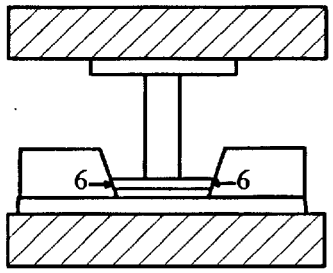
Fig. 2
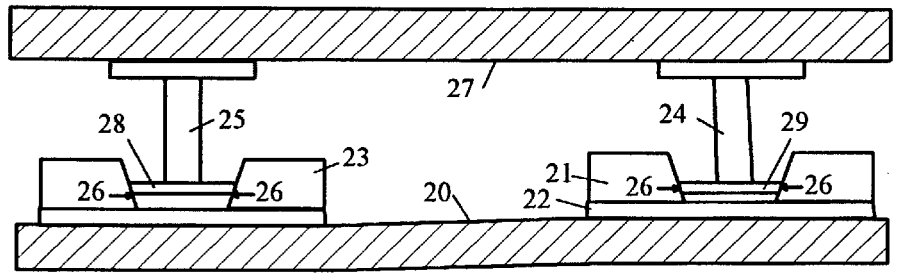
Fig. 3a       Fig. 3b
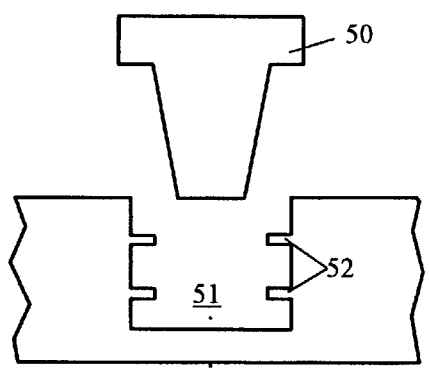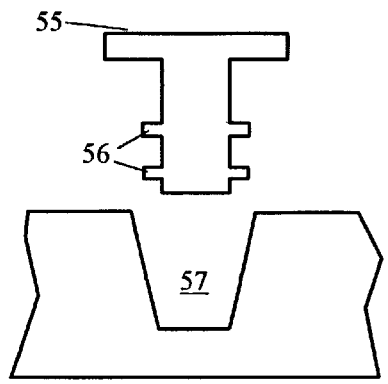

SELF-ASSEMBLED LOW-INSERTION FORCE CONNECTOR ASSEMBLY

REFERENCE TO PROVISIONAL APPLICATION

This application claims an invention which was disclosed in Provisional Application No. 60/039,060, filed Feb. 28, 1997, entitled "SELF-ASSEMBLED LOW-INSERTION FORCE CONNECTIONS". The benefit under 35 USC §119(e) of the United States provisional application is hereby claimed.

FIELD OF THE INVENTION

The invention pertains to the field of electrical connectors. More particularly, the invention pertains to small connectors suitable for chip- or board-level connections of the kind having interfitting inserts and receptacles.

BACKGROUND OF THE INVENTION

More than 70 million state-of-the-art microprocessor chips are sold each year. Each chip needs to be connected to a carrier or to the PCB directly. MCMs (Multi-Chip Modules) are high-end products requiring numerous connections for chip attachment. Bulky conventional pressure engaged connections require precious space that limits miniaturization, and prevents their use in chip attach applications.

State-of-the-art semiconductor chips entail dense structural complexity analogous to that of an entire city, all in an area of a few square centimeters. As the complexity increases, that "city" requires ever more "highways" or connections to other "cities" of the computer. The number of connections to and from a single chip can range up to a thousand, with five thousand predicted in a few years. As density increases, yield decreases, requiring that the chip or die be pre-tested. The industry requires robust, cost-effective high density solutions for pretesting dice, and for durable connections, solutions consistent with existing assembly practices.

Connections at all levels of a microelectronic system, that is from chip to board, are facing increasing challenge that results from demands in higher connection density at a lower cost. For example, "flip chip" area array solder joints for chip attach and ball grid array solder joints for connecting a chip carrier to card, can definitely increase the connection density, but often at a concomitant increase of cost per joint. Future connections need not only accommodate increased input/output (I/O) density at lower cost, but also to operate at high frequencies and under low voltages.

Flip chip technology includes any combination of techniques that directly attaches a silicon die with its active area face down to a substrate. Among these techniques, flip chip solder joint technology has been in use in the electronics industry for over thirty years. Worldwide, less than ten companies practice the flip chip solder joint technology in volume. Flip chip solder joint technology will be accelerated by strong new market drivers: use in low profile assemblies; and the proliferation of radio frequency devices. Alternatives to flip chip solder joint technology, such as conductive adhesives, are in the developmental stage. Demountable pressure engaged connections are not yet able to meet the various requirements discussed above.

At higher levels of a microelectronic system, soldered connections are also used. For example, for connecting a chip carrier or packaged chip to a printed circuit board, ball grid array (BGA) or surface mount solder joints are used. Demountable pressure engaged connections, such as the pin/socket type, are widely used for connecting a card to a board. The pin/socket type of connection, because of its bulkiness, will not be able to meet the input/output density needs of the future.

Area array flex circuit connections are being developed to replace the edge connector of a card, as a result of the demand of higher connection density. In general, pressure engaged connections are less costly compared to solder joints. However, the wider use of the former in high-end products has been inhibited also by their lower electrical and thermal stability, lack of the ability of self-assembly, and the need for large insertion force, which, when applied through the component to be attached, can result in component damage.

There have been many attempts in the prior art to achieve the low-insertion force and high contact force combination of the present invention, while maintaining miniaturization. The following examples show the range of solutions which have been tried. In all cases known to the present inventors, the connectors of the prior art have used spring action of the socket or the pins, or both. Where the pins are solid, they are straight (non-tapered), except perhaps for a rounded or pointed tip for centering.

Meuche, "EDUCATIONAL KIT FOR INSTRUCTION AND TESTING OF ELECTRICAL CIRCUITS", U.S. Pat. No. 3,008,245, uses a straight pin inserted into a socket having bumps which are plastically deformed to hold the pin in place.

Hotine, et al, "APPARATUS FOR CONNECTIONING ELEMENTS", U.S. Pat. No. 3,275,736, uses a ring having finger elements which are bent to grip a straight pin element. The elements are bent past the buckling region, then are pounded back down to grip the straight pin.

Bender, "WELDABLE FLEXIBLE CIRCUIT TERMINATION FOR HIGH TEMPERATURE APPLICATIONS", U.S. Pat. No. 5,514,839, also uses tabs extending inward to hold a straight pin element (see especially FIG. 3 a). The tabs are used as spring force elements in the bending force region, not in the buckling region.

Reimer, "PLANAR RECEPTACLE", U.S. Pat. No. 3,670,409, also uses fingers in the spring region to grip a straight pin, as does Shirling, "PIN GRID ARRAY HAVING SEPARATE POSTS AND SOCKET CONTACTS", U.S. Pat. No. 4,943,846, and others.

Evans, "METHOD OF MAKING RESILIENT PINS", U.S. Pat. No. 3,545,080, is an example of the use of pins which have spring elements. The pins are essentially straight (but for a pointed end for location), and have a spring-like section to grip straight-sided sockets.

Reymond, "SPRING BIASED TAPERED CONTACT ELEMENTS FOR ELECTRICAL CONNECTORS AND INTEGRATED CIRCUIT PACKAGES", U.S. Pat. No. 5,366,380, uses resilient contact elements which center into non-tapered holes and are pressed into place under the influence of the spring-like nature of the pins. No buckling is used, and the pin elements rest on the edge of, rather than insert into, the connection holes.

Kman et al, "PINNED MODULE", U.S. Pat. No. 5,548,486, shows the use of a straight pin with a bulged section, forced into a straight hole which is compressively deformed to grip the pin.

For a discussion of insertion force vs. contact force, see Yamada and Ueno, "Analysis of Insertion Force in Elastic/Plastic Mating", *Transactions of the ASME*, September 1990, vol. 112, pages 192–197.

SUMMARY OF THE INVENTION

The present invention is based on pressure engaged insert/receptacle type of connections that are self-assembling, and require a minimized insertion force to produce a high and tunable ("dialed in") contact force that is not applied through the component to be attached. Apart from differences in size, the same design principles are applicable from the chip level to the board level of a microelectronic system.

The invention uses interfitting components: a tapered element and a beam element which is deformed by the tapered element in the region where the primary contact force is buckling, rather than bending.

The invention comprises a low cost pressure engaged electrical and thermal connection, based on insert/receptacle structures in which the contact force and insertion force are separated. Such a design allows tunable contact force while it minimizes the insertion force and allows also for self-assembly and reworkability. They can readily be used in area array configurations and in conformal 3-D electronic packaging structures in all connection levels of a microelectronic system.

Pressure engaged, non-soldered "interposers" have been suggested as a potential connection solution, a class of connections to which the present invention belongs. Compared to known practices, the present invention results in advantages in cost and performance by offering, a) Low cost manufacturing and "self-assembly" and demountability
b) No solder reflow during assembly
c) High density with controlled high contact force and low insertion force
d) Compliant structure and tolerance against non-planarity and alignment inaccuracies
e) Reduced testing, burn-in, and rework cost
f) 3D and conformal packaging (solder flow does not allow curved surfaces)

BRIEF DESCRIPTION OF THE DRAWING

FIGS. 1a to 1c show a simplified diagram of an insert/receptacle connection, as the halves of the connection are interfitted.

FIG. 2 shows the how the connections of the invention have improved tolerance for non-planarity.

FIGS. 3a and 3b show examples of insert/receptacle combinations according to the invention.

DETAILED DESCRIPTION OF THE INVENTION

The pressure engaged, separable connection concept covered by the present invention relies on buckling of a beam or flange to produce the high contact force required. From here on, for simplicity, we shall use the terms, "beam element" or "beams", although the actual embodiment may more properly be characterized as a "flange" or "flanges". These beam elements are attached either to the insert or to the receptacle. The insertion force is determined by the bending (and/or frictional) force of the beams, the free ends of which reside against the tapered insert or receptacle walls, as depicted in the figures which are described in detail below.

The connection is made by sliding the insert into the receptor with an insertion force $F_{insert}$, as shown in FIG. 1. As soon as contact is made between the insert flange and the receptor wall, there is a force balance such that $F_{insert}$ is equal but opposite to the effective friction force $F_{friction}$ arising between the receptor wall and the flange tips, such that $$F_{insert} = (\mu + \tan \alpha) N$$

where N is the normal force (i.e., a combination of elastic compression and buckling forces of the flange tips), $\mu$ is the effective friction coefficient, and $\alpha$ is the tapering angle, as shown in FIGS. 3a and 3b. Note that the contact force is determined as N, which can be much larger than $F_{insert}$ at small tapers, since the typical friction coefficients are in the order of 0.01–0.2.

We consider below two limiting cases:

(a) When the flange is so rigid that it barely bends, the normal force N is mainly determined by elastic flange compression. In this case, during continued insertion, the friction coefficient rapidly enters the range of sticking friction, typically 0.1–0.2. Note that even in this case, the contact force N can be significantly larger than $F_{insert}$ at small tapers.

(b) When the flexural rigidity of flanges is such that they mainly bend instead of compressing, the normal force N is determined predominantly as the flange buckling force $F_{buckling}$. Most significantly, bending works to limit the magnitude of the insertion force when $$F_{friction} > F_{bending}$$

such that the insertion force is largely determined by the bending force as $$F_{insert} \approx F_{bending}$$

In this case the frictional resistance can be largely overcome because an increase of $F_{insert}$ will bend the flange more, freeing it from sticking such that the friction coefficient decreases to the range of dynamic sliding friction, to 0.01 or even below in the case of organic lubricants. Of course, the insertion force must still provide for the elastic energy stored in flange deformation when α>0; however in the case of small tapers this term will be small.

Figure 7:
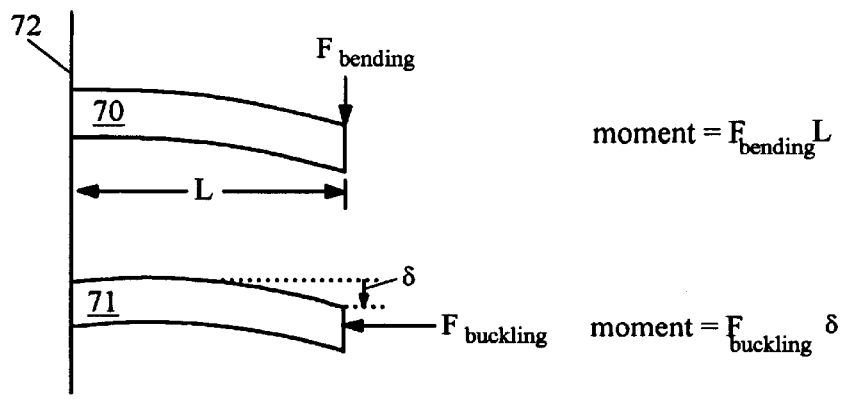
FIG. 7 shows a schematic diagram of the forces used by the invention.

FIG. 7 shows a schematic diagram of the bending force $F_{bending}$ and the normal force $N=F_{buckling}$ used in the present invention, as described in case (b) above. Two beams (70) and (71) are shown, both attached at one end to a fixed structure (72).

In beam (70), a bending force $F_{bending}$ is applied perpendicular to the long axis of the beam. The length of the beam is given as L, and the moment is thus calculated as:

$$\text{moment} = L \times F_{bending}$$

In beam (71), a buckling force $F_{buckling}$ is applied, along the longitudinal axis of the beam. The beam is deflected a distance represented by δ. In this case, the moment may be calculated as:

$$\text{moment} = \delta \times F_{buckling}$$

The applied dynamic bending force is required to produce the deflection δ during the mating of the insert and the receptacle. Once engaged, the static buckling force is required to maintain the deflection δ without the applied bending force. The two moments are, essentially equal, and we may equate the two terms as $$L \times F_{bending} \approx k \delta \times F_{buckling}$$

or, solving for bending force, $$F_{bending} \approx k \delta / L F_{buckling}$$

where k is a constant, close to 1, which accounts for the difference in the shape of the beam element before and after the bending force is applied.

Note that both $F_{bending}$ and $F_{buckling}$ depend on the deflection δ. While $F_{bending}$ increases linearly with deflection, for realistic off-axis loaded, bent beams, $F_{buckling}$ increases nonlinearly with deflection, approaching eventually the ideal buckling limit, as shown schematically in FIG. 7.

Thus, it can be seen that when the buckling displacement δ is much less than the length L, the bending force is very low as compared to the buckling force. If the connector is designed and operated in the region where L is much larger than δ, with the range of 10:1 to 100:1 preferred, then the invention will be operating mainly in the buckling range. At lower ratios the contact force will be dominated by elastic flange compression, and at higher ratios friction at the contact surface controls the insertion force.

Within the desired elastic buckling range, the insertion force is essentially controlled by the bending force and the contact force by the buckling force. Although these are separate forces the ratio between the bending force and the buckling force is proportional to the ratio between the amplitude of deflection and the length of the beam; therefore, the insertion force is significantly smaller than the contact force.

As a practical example, suppose a contact force of 50 grams is required for a proper conductance in a chip-to-substrate connection. If the ratio of L to δ is 50:1, then the insertion force is about 1 gram. If the chip has 400 connections, this requires a reasonable force of 400 grams or so. If the ratio were 5:1, then the insertion force would be 10 grams per connection, or 4 kg for the 400 connections, which could destroy the chip. If the chip has more than 400 connections (not an unreasonable number for today's LSI chips), or the ratio were much lower than 5:1, the insertion force would be destructively high.

Essentially same principles apply even if the beam deformation is partially plastic. It is emphasized that the concept of manipulating the ratio of the insertion force and the contact force proposed here is novel and not previously applied in the field of demountable connectors of microelectronics.

While the ratio of the insertion force and the contact force is controlled as discussed above, the magnitude of the insertion force is controlled by the rigidity of the beam element and the tapered element, the degree of taper of the tapered element (whether insert or receptacle), and the extent of the insertion of the elements. The taper is intentionally kept small also to increase the tolerance for non-planarity in an array of receptacles and to increase the wipe at the contact surface during insertion. The latter is important, to ensure a good electrical contact. The magnitude of the insertion force is optimized to allow easy insertion and demounting and at the same time be able to maintain a self-locking assembly after the insertion force is removed.

The rigidity of a practical connector is determined by the materials of construction and by the geometry of the connector. In general, a range of geometry is possible within the teachings of the invention, including variations in the shape of both elements. For example, cylindrical, conical, or ring elements could have other than circular cross sections. The opening of the receptacle can be purposely enlarged at the beginning to allow easy mating. More than one level of beam elements is also possible.

Surface finish and coating are desirable as currently practiced to maintain good electrical contact. The conductance of a connector will be a concern when its size is sufficiently reduced. Thus, in choosing the geometry of the connector, electrical considerations will enter, in addition to the mechanical requirements discussed above.

The various designs for the present invention can be illustrated by examining the insert/receptacle structure embodiment shown in FIG. 1a. The insert part of the connection is shown in the upper part of the figure, and consists of a cylindrical stem (1) attached to the contact pad (2), and topped by a flange (3) made of a high-conductivity metal with required mechanical attributes. The flange (3) is thus the beam element of the connector in this embodiment. The tapered element is the receptacle, shown in the lower part of the figure, comprising metal receptacle (4) attached to the contact pad (5) with a conical opening. The size of initial opening is chosen for easy alignment and insertion while the size of inner cone (or cylinder) is chosen so that a sufficient contact force is generated.

The connection is made by the insertion of the insert (FIG. 1b) to the receptacle with an insertion force $F_i$. As soon as contact is made between the insert flange and the receptacle cone, the force balances between these surfaces span three regions (refer to FIG. 7 for a diagram of these forces):

1) ($\delta \ll L$) When the flange (3) and the receptacle (4) are relatively rigid and the force required to produce bending is much greater than the insertion force, then the insertion force $F_i$ is roughly balanced by the effective friction force (assuming a small taper). In this case the contact force $F_c$ is related to the friction force by the effective friction coefficient which is typically on the order of 0.1 in the case of small taper. This ensures that the insertion force will be only a fraction of the contact force. The desired contact force may be chosen by selecting a suitable taper and stopping the insertion when the required insertion force (and consequently also contact force) has been reached.

2) ($\delta/L \rightarrow 0.01$) When the force required to produce bending is smaller than the friction force (see FIG. 1), the insertion of the flange is initially stopped by friction at its perimeter. In this case, however, insertion can still continue because bending of the flange leads to a reduction of the peripheral friction. When insertion is stopped and the applied force is removed, the elastic bending of the flange is maintained by the buckling forces $F_b$. By suitable selection of taper and flange shape, it is possible to produce a buckling force that increases with the insertion distance force. Thus a desired elastic buckling force, lying below the ultimate buckling limit, can be chosen by increasing the insertion force. Because the bending force is typically only a fraction of the buckling force, we can ensure a high contact force at a low insertion force. If the insert is forced into the receptacle laterally (as in FIGS. 9a and 9b), the flanges must buckle for the insertion to continue. Because the insertion force now causes buckling rather than bending, there is no relief in the sticking friction, and the previous case still applies.

3) ($\delta \approx L$) In this region the contact force is produced by a spring action. This is the region used by the prior art, and does not form part of the present invention.

By the choice of the stiffness of the connector, taper, and the friction at the contacting surfaces, we may operate in any region, or in any desired mixed mode between them. The contact surfaces can be roughened or smooth, as may be desired. It is easily seen that based on the design principle described, a range of embodiments are possible to achieve a low insertion force and a high, dialed-in contact force which is not applied through the component to be attached. The direction of insertion need not be normal (90°) to the flanges, but could be at any angle, including the case of lateral insertion (0°) shown in FIGS. 9a and 9b.

The term "dialed-in" force means that, since with the connection of the invention, the required insertion force increases as the depth of insertion increases, one can select a predetermined force limit and thereby determine the depth of insertion. With the prior art spring-action connections, once the spring is fully engaged the force of insertion is nearly constant, regardless of depth (at least until the connector hits bottom).

The connection of the invention provides pressure-engaged contact (6) at least at some points along the perimeter of the flange (3) and the annulus (4) of the mating contact. Although the insertion force is low, the contact force is high due to the compressive buckling force at the rim of the flange.

The flange or beam configuration enables separation of the contact force from the insertion force. For chip attach, low pressure is exerted on the chip to bend the flanges, although high compressive stress imposed at the flange tips secures the contact. Decreasing the insertion force reduces strains in the chip, lowering the chance of fracture and therefore increasing yield. The tapered cross-section allows the insertion force to be "dialed in" or controlled accurately.

The connection of the invention has a high tolerance for non-planarity in the connected structures, as can be seen in FIG. 2, where a chip (27) is mounted on a board (20) or other substrate which is not perfectly planar. Despite the non-planarity of the board (20), the possible bending in the flanges (28) and (29) and the posts (24) and (25) enables the inserts to make high compression contacts (26) over a range of insertion depths in the receptacles (21) and (23). This capability is consistent with the need for tolerance of non-planarity in the carrier and/or chip. The possible bending of post (24) and (25) will increase tolerance when the post and receptacle were not aligned.

As an additional advantage, upon insertion of the post into the receptacle, the flange wipes oxide and organic films from the contacting surfaces of the receptacle and insert, thus forming high quality metal-metal contacts.

In addition to the design shown in FIGS. 1 and 2, two examples of possible alternative insert/receptacle combinations are displayed in FIGS. 3a and 3b. FIG. 3a shows a simple conical insert (50) used with a conical or cylindrical receptacle (51) having flanges (52) inside. The alternative FIG. 3b shows a simple conical receptacle (57), mating with a cylindrical insert (55) having flanges (56). It will be seen that the embodiment of FIG. 3b is similar to the design of FIG. 1, with the addition of a second flange.

Figure 8:
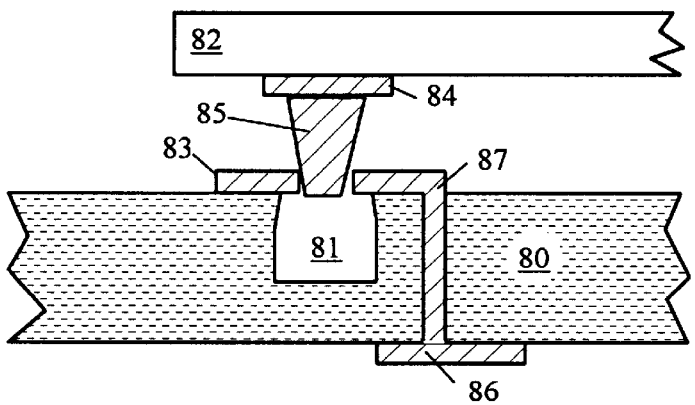
FIG. 8 shows an embodiment of the invention, in which the beam element is mounted on a substrate.
Figure 12:
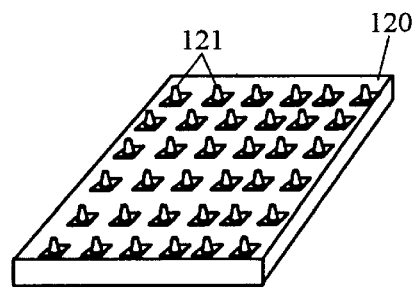
FIG. 12 shows how the tapered elements of the invention may be disposed on a chip, replacing the soldered method of chip attachment.
Figure 13:
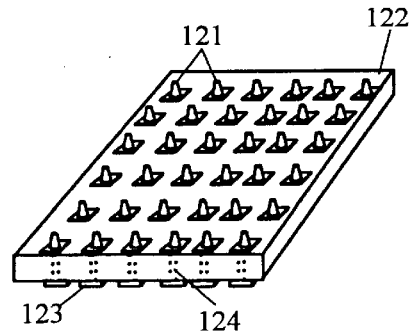
FIG. 13 shows how the tapered elements of the invention may be disposed on a substrate or carrier, with connections on the rear.
Figure 14:
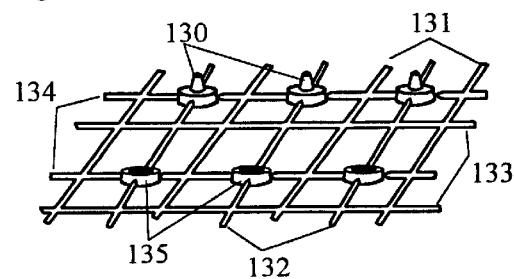
FIG. 14 shows a method of manufacturing the tapered elements of the invention.

FIG. 8 shows another embodiment of the invention, which may be used for chip-attach, or card-to-board connections, or the like. In the example shown in FIG. 8, chip (82), is being attached to the body of the receptacle (carrier) (80). One connection is shown for this cut-away example, but it will be understood that an array of connections will normally be provided. FIGS. 12 and 13 show such an array with a plurality of attaches (121) on chip (120) in FIG. 12, or on a carrier (122) with vias (124) leading to connection pads (123) in FIG. 13.

Returning to FIG. 8, A recess (81) in the substrate (80) provides room for the insert or tapered element (85), which is attached to the conductive land (84) on the chip, to be inserted. The beam element is a ring-shaped contact (83) having a central opening, in which the opening is centered over the recess (81), causing the edges of the opening to be cantilevered, providing room for the beam to deform. Alternatively, instead of a ring, the beam element could be a number of rectangular beams projecting over the recess, or even a single beam. The body of the receptacle (80) might be flexible to some extent in some applications, which would also aid the deformation of the beam element (83). If the flexibility of the body is sufficient, no cantilever would be required. The contact (83) is connected to a solder pad (86) on the bottom of the substrate (80) by a via (87). In use, the chip (82) is aligned over the substrate (80), with the tapered inserts (85) over the rings (83). The taper of the inserts (85) will act to self-center the connection to some degree. By adjusting the distance to which the tapered inserts (85) are pushed into the recesses (81), the contact force may be adjusted or "dialed in" as desired.

Figure 15A:
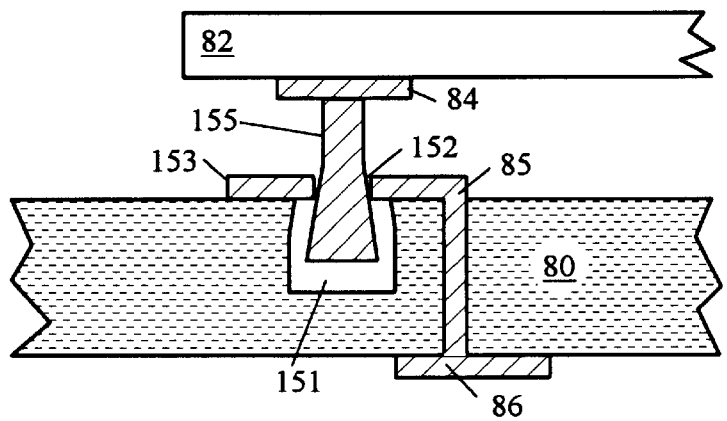
FIG. 15a shows a cut-away side view of an embodiment of the invention similar to that of FIG. 8, using a reverse-tapered tapered element and a keyhole shaped beam element.
Figure 15B:
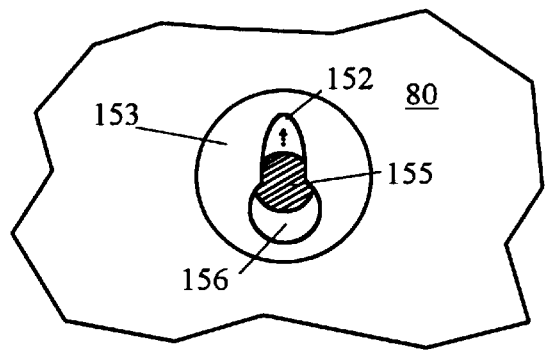
FIG. 15b shows a top view of the embodiment of FIG. 15a, cut-away through the tapered element, to show the keyhole shaped beam element.

FIGS. 15a and 15b show another embodiment related to the embodiment of FIG. 8, in which the insert (155) has a reverse taper. That is, the tapered insert is wider at the free end than at the point where it attaches to the land (84). The beam element (151), as in FIG. 8, is in the form of a ring with a central opening over a recess (151). However the opening here is shaped like a keyhole, with a larger circular portion (156), larger in diameter than the largest diameter of the reverse-tapered insert (155), connected to an elongated narrower portion (152) which is narrower than the widest diameter of the insert (155), but wider than its narrowest diameter. Thus, once inserted into the wide opening (156) and slid into position in the narrower portion (152), the insert is locked in and cannot pull out. The insert (155) is then pulled upward, away from the recess (151), and the reverse tapered insert (155) interacts with the beam element ring (153) just as the tapered insert (85) interacts with the ring (83) in FIG. 8.

Figure 11:
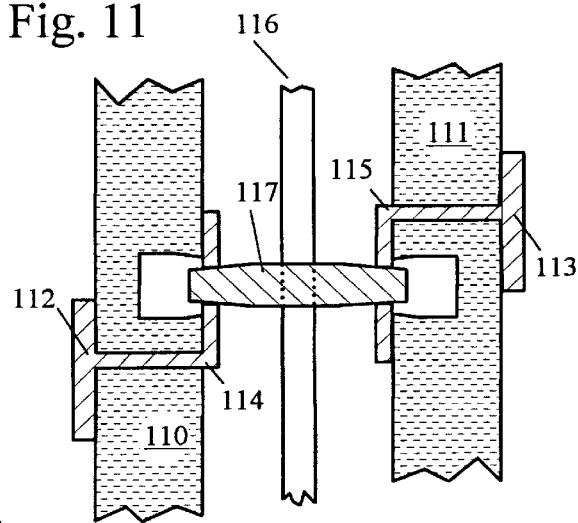
FIG. 11 shows an embodiment of the invention, in which the tapered element is doubled, and used to connect two beam elements.

FIG. 11 shows an application of the invention, in which the connector of the invention is essentially doubled, to be used to connect a pair of boards or substrates or other components to be connected (110) and (111). The beam elements (114) and (115) correspond to the single beam element (83) in FIG. 8, and the tapered element (117) is a cylindrical insert with a double taper to each end. The posts (117) can be located and held in place for insertion by an insulating carrier (116). As in FIG. 8, vias connect the beam elements (114) and (115) to solder pads (112) and (113), respectively, on the outer face of the components (110) and (111).

Figure 9A:
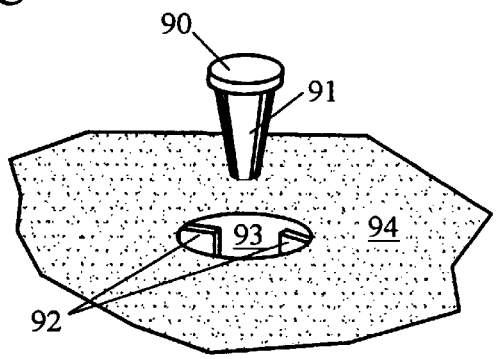
FIG. 9a shows a side perspective view of an embodiment of the invention in which the beam elements are vertically mounted on the sides of a recess.
Figure 9B:
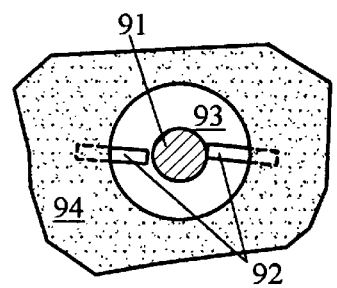
FIG. 9b shows the embodiment of FIG. 9a, from a top cut-away view.
Figure 9C:
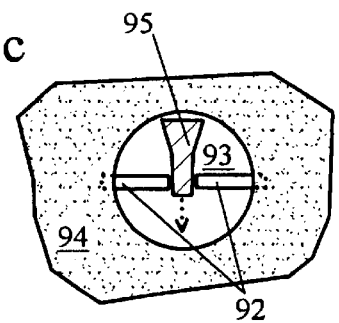
FIG. 9c shows a variation on the embodiment of FIG. 9a, using a sideways motion of a wedge-shaped tapered element.

As can be seen in FIGS. 9a, 9b, and 9c the beam element, shown as a horizontal ring (83) in FIG. 8, could also be constructed in the recess (93) in the substrate (94) as vertical strip he tapered element (91) would act to deform the beam elements (92) as the corresponding element (85) did the in the ring-type beam element (83) in FIG. 8, aided by the slight offset of the strips (92) from the radius of the recess (93).

In FIG. 9c, a variation on this embodiment is shown, in which the tapered element (insert) (95) is straight along its longitudinal axis, but tapered from side-to-side. In this embodiment, the insert would encounter no resistance when inserted into the recess (93), and then would be moved sideways into engagement with the beam elements (92). The insertion force on the insert (95), shown by the arrow, is sideways rather than downwards.

Figure 9D:
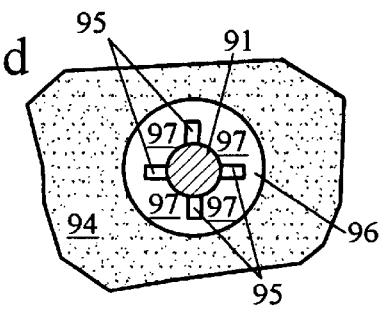
FIG. 9d shows another variation, in which the beam elements are formed by radial slots cut into a ring.

In FIG. 9d, it can be seen that the finger beam elements (97) can be formed from a ring or annulus (96), by cutting radial slots (95) outward from the central hole.

Thus, there are a number of variations possible within the teachings of the invention, so long as the two elements of the invention (tapered and beam) are present in the two parts of the connection: the insert and the receptacle, such that the insert is held in place by buckling flanges situated either in the insert or receptacle, or both. That is, the receptacle could be tapered and the beam element on the insert (as shown in FIGS. 1, 2, 3b, 4, 5, and 6), or the insert could be tapered and inserted into a receptacle having a beam element (as shown in FIGS. 3a, 8, 9a–c, 10, 11 and 15a–b).

Figure 16:
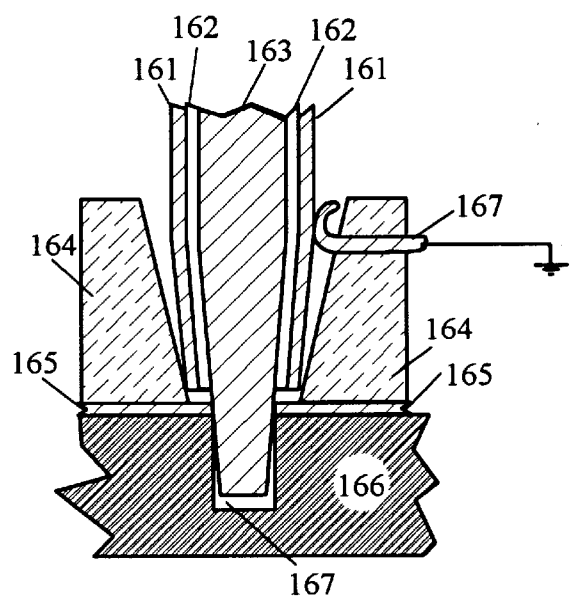
FIG. 16 shows another embodiment of the invention, in which the tapered element is a coaxially shielded pin, and further including a guide element.

FIG. 16 shows another embodiment of the invention, in which the tapered element (163) is a pin which is, over much of its length, covered with a coaxial shield (161), which can be grounded by a conventional contact (167). A coaxial insulating layer (162) separates the shield (161) from the pin (163). The end of the tapered element (163) inserts into recess (167) contacts the beam element (165) which is shown as being supported along its length by resilient substrate (166). The resiliency of the substrate allows it to "give" slightly, providing room for the beam element to move, much as the cantilever effect shown in the other figures.

Also shown in FIG. 16 is a guide element (164), which projects above the beam element (165) with a tapered hole to guide and center the pin (163) into the recess (167). In other embodiments, for example where the invention is used to connect integrated circuits to a circuit board, the guide element may be a polymer coating over the board, with tapered holes over the recesses to guide the pins on the ICs into the connections.

It is worth noting in all cases of pressure engaged connections currently practiced for chip attach, such as conductive adhesives, the insertion force is the same as the contact force—which can become impractical when the number of I/O's is high. On the other hand, the contact force of a traditional pin/socket connection, such as the ones used as edge connections to attach a circuit containing card to a printed wiring board, is separated from the insertion force. However, a sufficiently high contact force can be produced only by a strong spring which is often bulky.

The connector assembly of the present invention can be left permanently self-assembled. However, if desired, after testing or burn-in they can be permanently attached by soldering or applying an adhesive (which might be conductive), or simply held together by a compressive clamp.

In general, the length of the beam and the aspect ratio of the tapered element controls the compliance of the system. Larger compliance usually means better reliability. The tolerance to non-planarity and alignment inaccuracies is achieved by the choice of the length of the insert and the size and shape of the opening of the receptacle, the taper of the tapered element, and length of the beam element lever arm. A stem could be added to the pin to add additional flexibility.

The term "contact dimension" of the beam element has been used herein to mean the length of finger elements, or the radial thickness of rings, or the equivalent dimension on other beam elements which might be constructed in accordance with the teachings of the invention. In connection with the tapered element, the term "contact dimension" is used to mean the diameter of round pins, or the width or thickness of rectangular inserts, or the equivalent dimension of other shapes of tapered elements which might be constructed in accordance with the teachings of the invention.

DESCRIPTION OF APPLICATIONS

A) Area Array Connections

Figure 4:
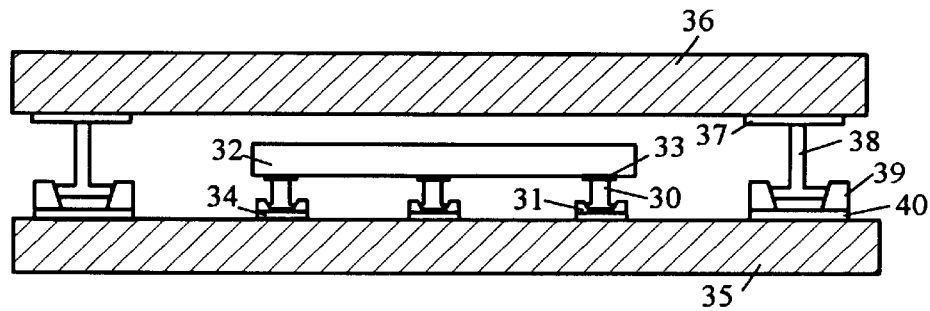
FIG. 4 shows part of a three dimensional structure using the connections of the invention.

The following applications are illustrated in FIG. 4.

A1) Chip Attach: This application is intended to replace flip chip solder joints and a variety of pressure engaged connections. A typical pad pitch will be 10 mils or less with a 5 mils or less pad size. Because of the dimensions involved, a clean room is required for processing. After assembly, the connections may need to be encapsulated for environmental protection. As shown in FIG. 4, using the connection of the invention, the inserts (30) are attached to the connection pads (33) on the chip (32) and the receptacles (31) are attached to the pads (34) on the substrate (35) (or vice versa). If the substrate is flexible the required insertion force can be smaller because load can be applied to a few rows at a time instead of to the entire chip.

A2) Chip Carrier Attach: This application is intended to replace ball grid array solder joints and a variety of alternative pressure engaged connections, for attaching ceramic, laminate or flex substrates to a printed circuit board. A typical pad pitch will be 50 mils or less with a 25 mils or less pad size.

A3) Stacking Circuit Containing Cards for 3D Conformal Structures: Connections of the same dimensions as the ones of A2 or larger can be used to connect a stack of circuit-containing cards to construct 3D packages, as shown in FIG. 4. A first card (36) is attached to a second card (35) using the connections of the invention. The inserts (38) are connected to the pads (37) of the first card (36), and the receptacles (39) to the matching pads (40) of the second card (35). If the cards used are flexible, conformal structure will then be possible.

B) Edge Connections

Figure 5:
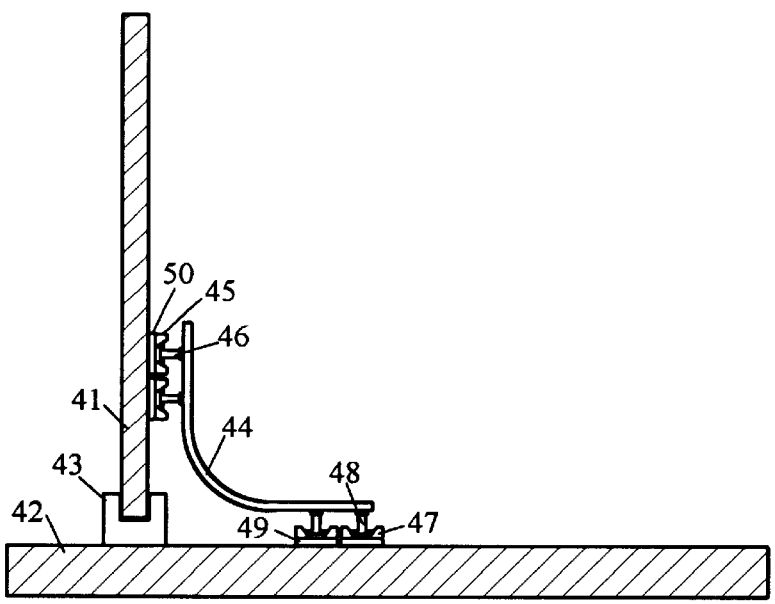
FIG. 5 shows the connection of the invention used with a flexible connection for a board.

An area array of connection pads can be used to increase the number of connections at a card or chip edge, as is shown in FIG. 5. In general, the two arrays of pads on the parts to be connected—(50) on the card (41) and (49) on the board (42)—are normal to each other. The pad pitch of the two arrays may not be equal. The receptacles (45) on the card (41) and receptacles (47) on the board (42), are placed at whatever pitches are appropriate for their respective applications. Flexible circuits (44) are used to provide directional and spatial transformation, with inserts (46) and (48) arranged to mate with the receptacles (45) and (47). Molded polymer adapters can also be used provided they can be easily circuitized. It is not expected that the flexible circuits will be adequate mechanically to keep the two parts in their relative position. Some form of mechanical guide (43) can be used to support the card (41) on the board (42) as needed.

B1) Chip Attach: Memory chips where the number of I/O's are not high and the voltage drop across the chip is not a concern can be attached on their edge to form a memory cube.

B2) Chip Carrier Attach: For large chips, such as a microprocessor, where the voltage drop across the chip is a concern, a 3D structure can still be formed by attaching the chip carriers on their edge, with heavier copper busses than are possible on the chips themselves.

B3) Card Attach: Currently the traditional pin/socket type of connector cannot provide the I/O density required by a high end card. A variety of flexible circuits have been developed to meet this need. They often are attached through a cumbersome mechanical clamp. The present invention offers advantages in self-assembly, and in cost and performance and should provide an effective alternate to the current practice. It is envisioned that card attach as shown in FIGS. 4 and 5 could be an important application of the present invention.

Figure 10:
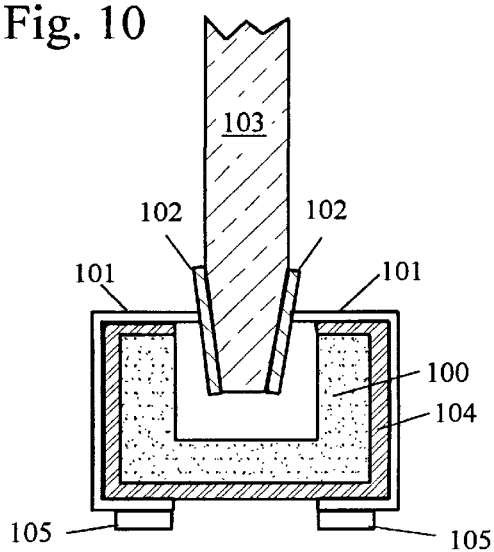
FIG. 10 shows an embodiment of the invention, used as an edge-connector for a printed circuit board.

FIG. 10 shows another way that the principles of the invention could be used as a card-edge connection. The edge of the printed-circuit card (103) is tapered slightly at the point where the edge lands (102) appear. Alternatively, an attachable tapered edge section could be prepared, to allow the connection of the invention to be used with existing cards. A receptacle body (100), with a central recess (106), is covered on the outside by a flexible substrate (104). The beam elements (101) are attached to the substrate (104) and extend over the recess (106), arranged to contact a bank of edge lands (102). The insertion force is low, and the contact force can, as in the other embodiments, be dialed in by adjusting the extent of insertion. The beam elements (101) can be continued around the sides of the body (100), and attached to connection pads (105) on the rear of the body (100) for electrical connections.

C) Peripheral Chip Attach

Figure 6:
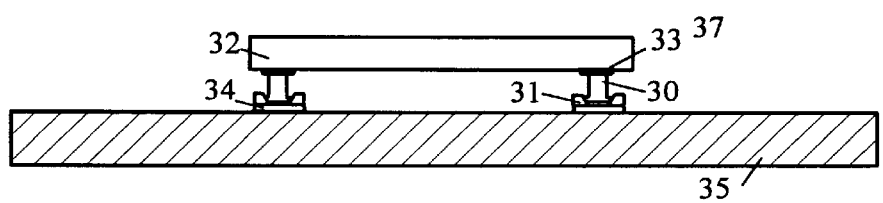
FIG. 6 shows a chip using the connection of the invention for peripheral connections.

In this application the connection pads for wire bonding are used to attach the insert as depicted in FIG. 6. The inserts in this case may be produced by roll coining a round wire such that they will be connected in series to allow the use of a modified wire bonding machine for attachment. Since more than 95% of the chips are produced for wire bonding, peripheral attach can be an important application of the present invention. It should be realized when the pad pitch on a chip is small, matching pad pitch on the chip carrier is required.

METHODS OF FABRICATION

Mechanical forming, chemical forming, and electroforming are three major approaches by which the parts of the present invention can be fabricated. Within these three approaches a large number of choices of methods of fabrication exist. The discussions given below will serve to illustrate the concepts involved, without limiting the invention to the methods described.

A) Mechanical Forming

A1) Area Arrays: Both the insert and the receptacle can be formed using progressive dies in a patterned array connected by hangers for handling and positioning, as shown for inserts in FIG. 13.

Progressive dies allow the forming of the suitable blanket first, which is then finished by coining the inserts (130) or receptacles (135) to produce the final product. After attachment the hangers (131), (132), (133) and (134) can be removed mechanically.

A2) In Series: Roll coining can be used to form inserts connected in series from a round wire. Progressive dies are also needed to finish the product in steps. Products of this form facilitate the attachment of the insert by using a modified wire bonding machine to the bonding pads on a chip.

B) Etching

A patterned array of receptacles connected by hangers can be formed by chemical etching of a copper sheet of proper thickness. In order to produce a tapered opening, the etching rate has to be optimized to produce the desired taper while maximizing the rate of production.

C) Electrolytical Plating

Inserts can be plated directly onto connection pads on a chip or onto a suitable carrier through photoresist containing properly shaped openings. In the latter case the photoresist may be left in place for subsequent handling or the photoresist can be patterned to produce hangers between two inserts.

D) Area Array Adaptor

If roll coining is proven to be a lower cost method of fabrication, the inserts produced can be placed in a patterned array in a polymer carrier for ease of handling for area array applications.

METHODS OF ATTACHMENT

As in fabrication, a large number of choices of methods of attachment is available. In the following, three principal approaches are described.

A) Metallurgical Bonding

Solders and low melting temperature alloys including eutectics can be used to facilitate metallurgical bonding by reflow. If the amount of the alloys used are reduced, mechanical force may be required during reflow to aid bonding.

B) Thermal-Mechanical Bonding

The wire bonding technology can be used to attach inserts to peripheral pads on a chip.

C) Conductive Adhesives

During the curing of adhesives, mechanical forces are usually required to enhance metal-to-metal bonding.

MATERIALS SELECTION

The elements of the invention can be made of a wide variety of materials. Metals of high electrical and/or thermal conductivity would be especially appropriate, and high elastic modulus and yield strength are also desirable in order to sustain high contact force. The inserts and receptacles can be coated with a coating having attributes which would enhance the electrical/thermal properties of the contact surfaces, and the surfaces can be selectively roughened or smooth, as might be required for a given application.

The following metals and alloys would be appropriate for the elements of the invention, although other metals could be used:

Copper and alloys with or without noble metal coatings
Nickel and alloys with or without noble metal coatings
Gold and alloys
Palladium and alloys Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. An electrical connector assembly comprising:
   a) a tapered element having a length and a contact dimension which tapers along at least a portion of the length from a larger dimension to a smaller dimension; and
   b) a beam element having a contact dimension chosen such that when the tapered element and beam element are mutually interfitted, the tapered element will make contact with the beam element at a location along the tapered portion of the length of the tapered element, the tapered element and the beam element mutually interfitting such that during insertion of the elements into each other by an insertion force, when the tapered element contacts the beam element at the location, and then is inserted further, then after the insertion force is removed, at least one of the elements is deformed primarily in the buckling region, such that the force of contact is primarily a buckling force.

2. The connector assembly of claim 1, in which:
   a) the tapered element is a socket having a length, and a width perpendicular to the length, the width tapering from an insertion end to an inner end; and
   b) the beam element comprises a pin having an end, an axis and a beam member formed perpendicular to the axis of the pin.

3. The connector assembly of claim 2, in which the tapered element is cylindrical, and the beam member is a disk.

4. The connector assembly of claim 1, in which:
   a) the tapered element is a pin having a width which tapers from a first end to a second end, the second end being the end which is to be inserted into the beam element;
   b) the beam element comprises a ring member having an opening adapted to contact the tapered element along its length when the tapered element is inserted into the opening, the opening being wider than the width of the tapered element at its second end, but narrower than the width of the tapered element at its first end.

5. The connector assembly of claim 4, in which the tapered element is a tapered cylindrical pin, and the beam element is a flat ring mounted on a substrate, the flat ring having a central opening, the opening in the center of the flat ring being centered over a recess in the substrate, the recess in the substrate being at least as large in diameter as the opening in the flat ring.

6. The connector assembly of claim 5, in which the diameter of the opening in the flat ring is smaller than the diameter of the recess, such that the edges of the opening are cantilevered over the recess.

7. The connector assembly of claim 1, in which the beam element comprises a body having a void therein into which the tapered element may be inserted, and at least one finger element having a first end supported by the body and a second end extending into the void, not supported by the body.

8. The connector assembly of claim 1, in which the beam element comprises a body having a void therein into which the tapered element may be inserted and at least one finger element, supported by the body, and having an end located adjacent to the void in the body, the body being resilient at least in the area adjacent to the end of the finger element adjacent to the void.

9. The connector assembly of claim 1, in which the tapered element is a tapered pin, and the beam element comprises a recess in a substrate, the recess having an axis, a length, and sides, the beam element further comprising at least one finger element extending from the side of the recess along the length thereof.

10. The connector assembly of claim 9, in which the finger element extends radially from a side of the recess toward the axis thereof.

11. The connector assembly of claim 9, in which the finger element extends from a side of the recess toward the axis, but is offset from the radius of the cylinder.

12. The connector assembly of claim 1, further comprising means for retaining the elements in interfitting relationship after insertion.

13. The connector assembly of claim 12, in which the means for retaining the elements is an adhesive.

14. The connector assembly of claim 13, in which the adhesive is conductive.

15. The connector assembly of claim 12, in which the means for retaining the elements comprises soldering the elements together.

16. The connector assembly of claim 12, in which the means for retaining the elements comprises a clamp.

17. The connector assembly of claim 1, in which the taper of the tapered element varies along the length of the tapered element.

18. The connector assembly of claim 1, in which the tapered element is a slender, flexible pin.

19. The connector assembly of claim 1, in which at least one of the elements is deformed during insertion primarily in the bending region of deformation, and the force of insertion is primarily a bending force.

20. The connector assembly of claim 19, in which the element deformed is the beam element.

21. The connector assembly of claim 19, in which the element deformed is the tapered element.

22. The connector assembly of claim 1, in which the element deformed is the beam element.

23. The connector assembly of claim 1, in which the element deformed is the tapered element.

24. The connector assembly of claim 1, in which the beam element is not significantly deformed and the force of insertion is primarily a frictional force.

25. An electrical connector assembly for use in connecting an electrical component having at least one electrically conductive pin operatively connected thereto, to a substrate having at least one electrically conductive receptacle mounted thereon for establishing a physical and electrical connection with the electrically conductive pin, in which:

the electrically conductive pin of the electrical component is tapered along at least a portion of its length from a larger dimension to a smaller dimension;

the electrically conductive receptacle mounted on the substrate comprises a beam element having a contact dimension chosen such that when the electrically conductive pin and electrically conductive receptacle are mutually interfitted, the electrically conductive pin will make contact with the beam element at a location along the length of the pin in the portion which is tapered, the electrically conductive pin and the beam element mutually interfitting such that during insertion of the elements into each other by an insertion force, when the electrically conductive pin contacts the beam element at the location, and then is inserted further, after the insertion force is removed, at least one of the pin or the beam element is deformed primarily in the buckling region, such that the force of contact is primarily a buckling force.

26. The electrical connector assembly of claim 25, further comprising an electrical component having at least one electrically conductive pin operatively connected thereto.

27. The electrical connector assembly of claim 26, in which the electrical component is a microchip.

28. The electrical connector assembly of claim 25, further comprising a substrate having at least one electrically conductive receptacle mounted thereon for establishing a physical and electrical connection with the electrically conductive pin.

29. The electrical connector assembly of claim 28, in which the substrate is a chip carrier.

30. The connector assembly of claim 25, in which at least one of the beam element or the pin is deformed during insertion primarily in the bending region of deformation, and the force of insertion is primarily a bending force.

31. The connector assembly of claim 25, in which the beam element is not significantly deformed during insertion and the force of insertion is primarily a frictional force.

* * * * *